(12) United States Patent  
Yamada

(10) Patent No.: US 9,536,921 B2  
(45) Date of Patent: Jan. 3, 2017

(54) RADIATION IMAGE-PICKUP DEVICE AND RADIATION IMAGE-PICKUP DISPLAY SYSTEM

(71) Applicant: Sony Corporation, Tokyo (JP)

(72) Inventor: Yasuhiro Yamada, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 45 days.

(21) Appl. No.: 14/456,905

(22) Filed: Aug. 11, 2014

(65) Prior Publication Data

US 2015/0053865 A1    Feb. 26, 2015

(30) Foreign Application Priority Data

Aug. 20, 2013   (JP) ................. 2013-170332

(51) Int. Cl.  
*G01T 1/24*  (2006.01)  
*H01L 27/146*  (2006.01)

(52) U.S. Cl.  
CPC ... *H01L 27/14663* (2013.01); *H01L 27/14601* (2013.01); *H01L 27/14603* (2013.01); *H01L 27/14659* (2013.01)

(58) Field of Classification Search  
CPC ........................................... G01T 1/24  
See application file for complete search history.

(56) References Cited

U.S. PATENT DOCUMENTS

2011/0204246 A1*  8/2011  Tanaka et al. ........... 250/370.08

FOREIGN PATENT DOCUMENTS

JP    2004-265935 A    9/2004  
JP    2008-252074 A    10/2008

* cited by examiner

*Primary Examiner* — David Porta  
*Assistant Examiner* — Hugh H Maupin  
(74) *Attorney, Agent, or Firm* — Wolf, Greenfield & Sacks, P.C.

(57) ABSTRACT

A radiation image-pickup device includes: a plurality of pixels each configured to generate signal charge based on radiation; and a field effect transistor used to read the signal charge from each of the plurality of pixels, wherein the field effect transistor includes a semiconductor layer including an active layer and a low concentration impurity layer formed to be adjacent to the active layer, and a first and a second gate electrode disposed to face each other with the active layer interposed therebetween, and one or both of the first and the second gate electrodes are provided in a region not facing the low concentration impurity layer.

15 Claims, 16 Drawing Sheets

RADIATION IMAGE-PICKUP DEVICE AND RADIATION IMAGE-PICKUP DISPLAY SYSTEM

CROSS REFERENCE TO RELATED APPLICATIONS

This application claims the benefit of Japanese Priority Patent Application JP2013-170332 filed Aug. 20, 2013, the entire contents of which are incorporated herein by reference.

BACKGROUND

The present disclosure relates to a radiation image-pickup device suitable for, for example, X-ray photography for medical application and nondestructive inspection, and to a radiation image-pickup display system using such a radiation image-pickup device.

Radiation image-pickup devices obtaining an image signal based on, for example, radiation such as X-rays have been proposed (for example, see Japanese Unexamined Patent Application Publication Nos. 2008-252074 and 2004-265935).

SUMMARY

In the above-described radiation image-pickup devices, a thin film transistor (TFT) is used as a switching element provided to read signal charge based on radiation from each pixel. It has been expected to achieve an element structure highly reliable with respect to radiation, in such a transistor.

It is desirable to provide a radiation image-pickup device capable of improving reliability, and a radiation image-pickup display system including such a radiation image-pickup device.

According to an embodiment of the present disclosure, there is provided a radiation image-pickup device including: a plurality of pixels each configured to generate signal charge based on radiation; and a field effect transistor used to read the signal charge from each of the plurality of pixels, wherein the field effect transistor includes a semiconductor layer including an active layer and a low concentration impurity layer formed to be adjacent to the active layer, and a first and a second gate electrode disposed to face each other with the active layer interposed therebetween, and one or both of the first and the second gate electrodes are provided in a region not facing the low concentration impurity layer.

According to an embodiment of the present disclosure, there is provided a radiation image-pickup display system including: a radiation image-pickup device; and a display configured to perform image display based on an image pickup signal obtained by the radiation image-pickup device, wherein the radiation image-pickup device includes a plurality of pixels each configured to generate signal charge based on radiation, and a field effect transistor used to read the signal charge from each of the plurality of pixels, and the field effect transistor includes a semiconductor layer including an active layer and a low concentration impurity layer formed to be adjacent to the active layer, and a first and a second gate electrode disposed to face each other with the active layer interposed therebetween, and one or both of the first and the second gate electrodes are provided in a region not facing the low concentration impurity layer.

In the radiation image-pickup device and the radiation image-pickup display system according to the above-described embodiments of the present disclosure, in the field effect transistor used to read the signal charge from each of the pixels, the first and the second gate electrodes are disposed to face each other with the active layer interposed therebetween. Further, one or both of the first and the second gate electrodes are provided in the region not facing the low concentration impurity layer. Therefore, occurrence of a leakage current at OFF time of the transistor is suppressed, and an element life is improved.

According to the radiation image-pickup device and the radiation image-pickup display system of the above-described embodiments of the present disclosure, in the field effect transistor used to read the signal charge from each of the pixels, the first and the second gate electrodes are disposed to face each other with the active layer interposed therebetween. Further, one or both of the first and the second gate electrodes are provided in the region not facing the low concentration impurity layer. Therefore, improvement of the element life is allowed. Accordingly, enhancement of reliability is allowed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present technology, and are incorporated in and constitute a part of this specification. The drawings illustrate embodiments and, together with the specification, serve to describe the principles of the technology.

DETAILED DESCRIPTION

An embodiment of the present disclosure will be described below in detail with reference to the drawings. It is to be noted that the description will be provided in the following order.
1. Embodiment (an example of a radiation image-pickup device using a TFT in which two gate electrodes are provided in a region not facing an LDD layer)
2. Modifications 1 and 2 (other examples of a passive pixel circuit)
3. Modification 3 and 4 (examples of an active pixel circuit)
4. Application example (an example of a radiation image-pickup display system)

Embodiment

Configuration

Figure 1:
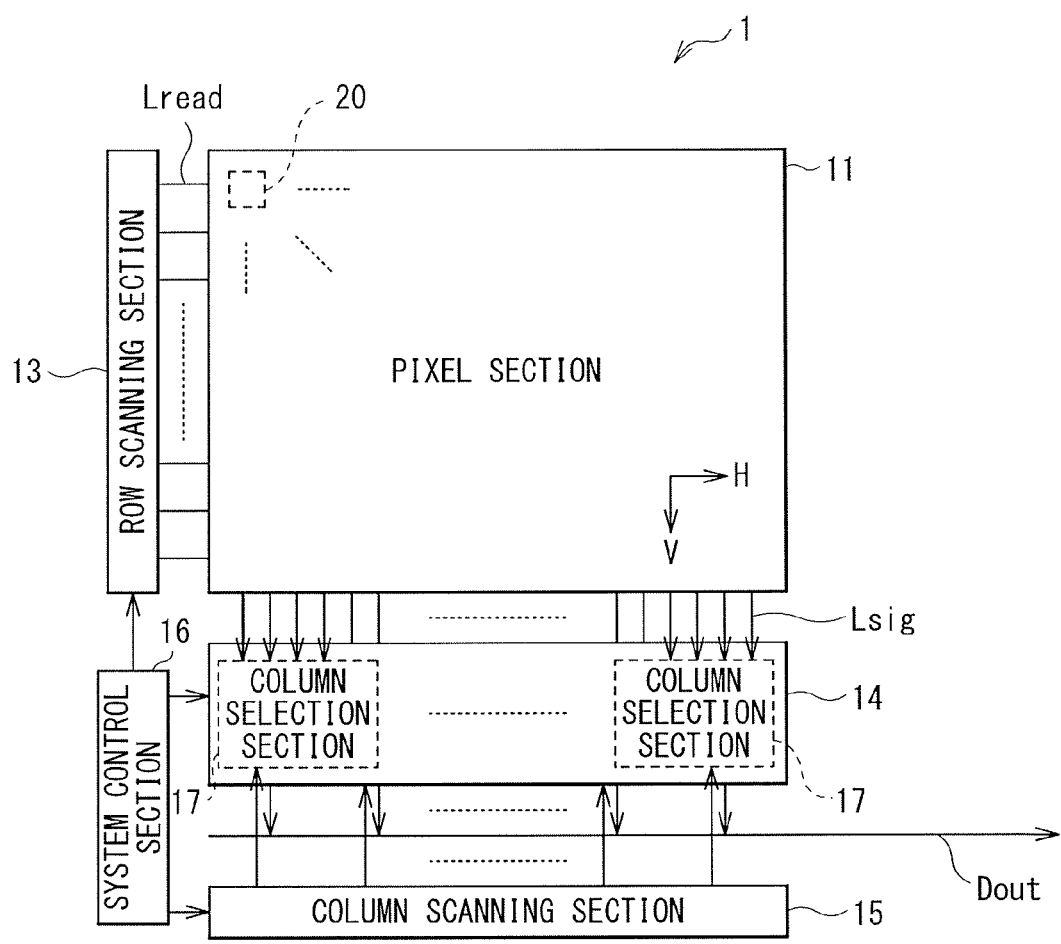
FIG. 1 is a block diagram illustrating an overall configuration of a radiation image-pickup device according to an embodiment of the present disclosure.

FIG. 1 illustrates a block configuration of an entire radiation image-pickup device (a radiation image-pickup device 1) according to an embodiment of the present disclosure. The radiation image-pickup device 1 may, for example, read information of a subject (picks up an image of a subject) based on entering radiation Rrad (such as alpha rays, beta rays, gamma rays, and X-rays). The radiation image-pickup device 1 includes a pixel section 11. The radiation image-pickup device 1 further includes, as drive circuits (a peripheral circuit section) of the pixel section 11, a row scanning section 13, an analog-digital (A/D) conversion section 14, a column scanning section 15, and a system control section 16.
(Pixel Section 11)

Figure 2A:
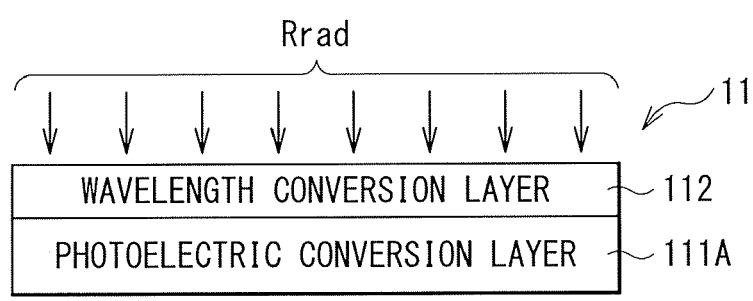
FIG. 2A is a schematic diagram illustrating a schematic configuration of a pixel section in a case of an indirect conversion type.
Figure 2B:
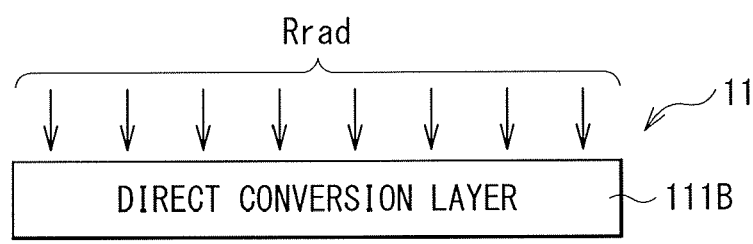
FIG. 2B is a schematic diagram illustrating a schematic configuration of a pixel section in a case of a direct conversion type.

The pixel section 11 includes a plurality of pixels (image pickup pixels, or unit pixels) 20 generating signal charge based radiation. The pixels 20 are two-dimensionally arranged in rows and columns (in a matrix). It is to be noted that, as illustrated in FIG. 1, a horizontal direction (a row direction) in the pixel section 11 will be referred to as an "H" direction, and a vertical direction (a column direction) will be referred to as a "V" direction. The radiation image-pickup device 1 may be either of, so-called, an indirect conversion type and a direct conversion type, if a transistor 22 to be described later is used as a switching element provided to read the signal charge from the pixel section 11 (the pixel 20). FIG. 2A illustrates a configuration of the pixel section 11 of the indirect conversion type, and FIG. 2B illustrates a configuration of the pixel section 11 of the direct conversion type.

In the case of the indirect conversion type (FIG. 2A), the pixel section 11 includes a wavelength conversion layer 112 on a photoelectric conversion layer 111A (on a light-receiving-surface side). The wavelength conversion layer 112 converts the radiation Rrad to a wavelength in a sensitivity range of the photoelectric conversion layer 111A (for example, visible light). The wavelength conversion layer 112 may be configured of a phosphor (for example, a scintillator such as CsI (Tl-added), $Gd_2O_2S$, BaFX (X is Cl, Br, I, or the like), NaI, and $CaF_2$) converting X-rays to visible light, for example. The wavelength conversion layer 112 described above is formed on the photoelectric conversion layer 111A, with a flattening film interposed therebetween. Examples of a material of the flattening film may include an organic material and a spin-on-glass material. The photoelectric conversion layer 111A includes a photoelectric conversion element (a photoelectric conversion element 21 to be described later) such as a photodiode.

In the case of the direct conversion type (FIG. 2B), the pixel section 11 includes a conversion layer (a direct conversion layer 111B) that generates an electric signal (a positive hole and an electron) by absorbing the radiation Rrad that has entered. The direct conversion layer 111B may be configured of, for example, a material such as an amorphous selenium (a-Se) semiconductor and a cadmium tellurium (CdTe) semiconductor.

In this way, the radiation image-pickup device 1 may be of either the indirect conversion type or the direct conversion type. However, the following embodiment and the like will be described by taking mainly the case of the indirect conversion type as an example. In other words, in the pixel section 11, as will be described later in detail, the radiation Rrad is converted to visible light in the wavelength conversion layer 112, and this visible light is converted to an electric signal in the photoelectric conversion layer 111A (the photoelectric conversion element 21), to be read out as signal charge.

Figure 3:
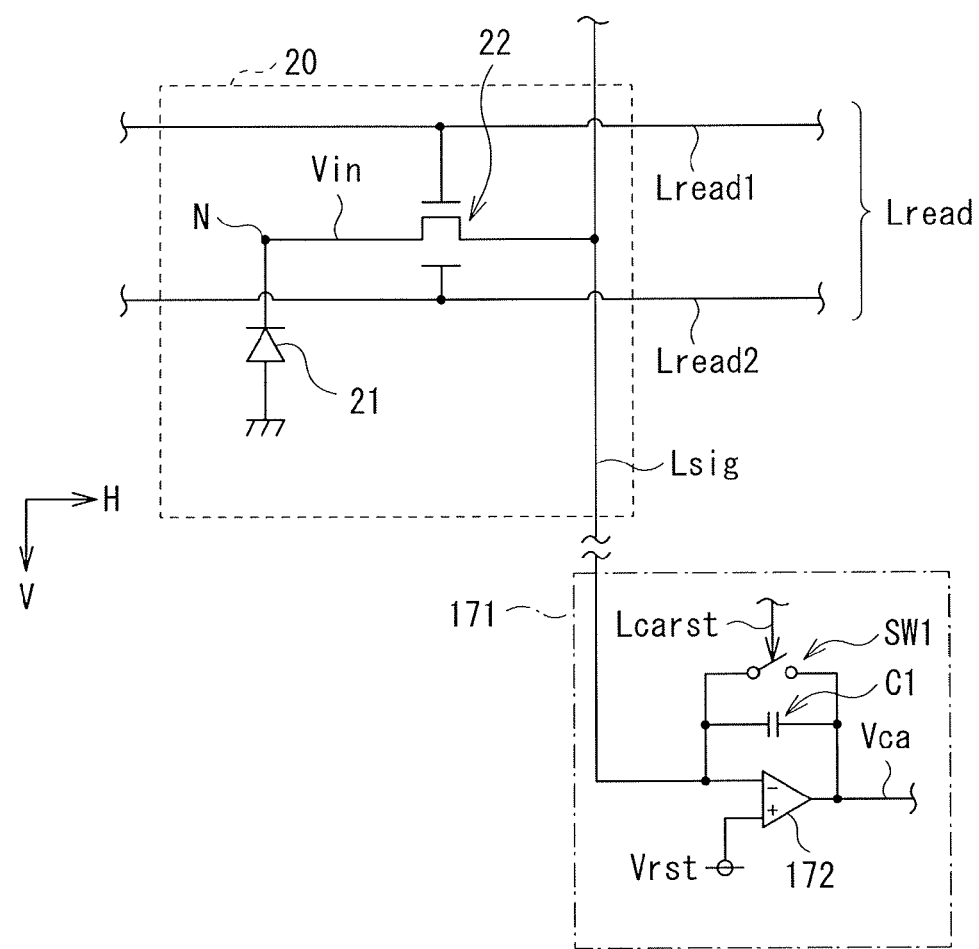
FIG. 3 is a circuit diagram illustrating a detailed configuration example of components including a pixel illustrated in FIG. 1.

FIG. 3 illustrates an example of a circuit configuration (a so-called passive circuit configuration) of the pixel 20, together with a circuit configuration of a charge amplifier circuit 171 to be described later provided in the A/D conversion section 14. The passive pixel 20 may include, for example, the one photoelectric conversion element 21 and the one transistor 22. Further, a readout control line Lread extending in the H direction and a signal line Lsig extending in the V direction are connected to the pixel 20.

The photoelectric conversion element 21 may be configured of, for example, a positive-intrinsic-negative (PIN) photodiode or a metal-insulator-semiconductor (MIS) sensor, and may generate the signal charge of a charge amount corresponding to an entering light quantity, as described above. It is to be noted that, here, a cathode of the photoelectric conversion element 21 is connected to a storage node N.

The transistor 22 is a transistor (a readout transistor) that outputs the signal charge (an input voltage Vin) obtained by the photoelectric conversion element 21 to the signal line Lsig, by changing to an ON state in response to a row scanning signal supplied through the readout control line Lread. The transistor 22 may be configured using, for example, an N-channel-type (N-type) field effect transistor (FET). However, the transistor 22 may be configured using other type such as a P-channel-type (P-type) FET.

Figure 4:
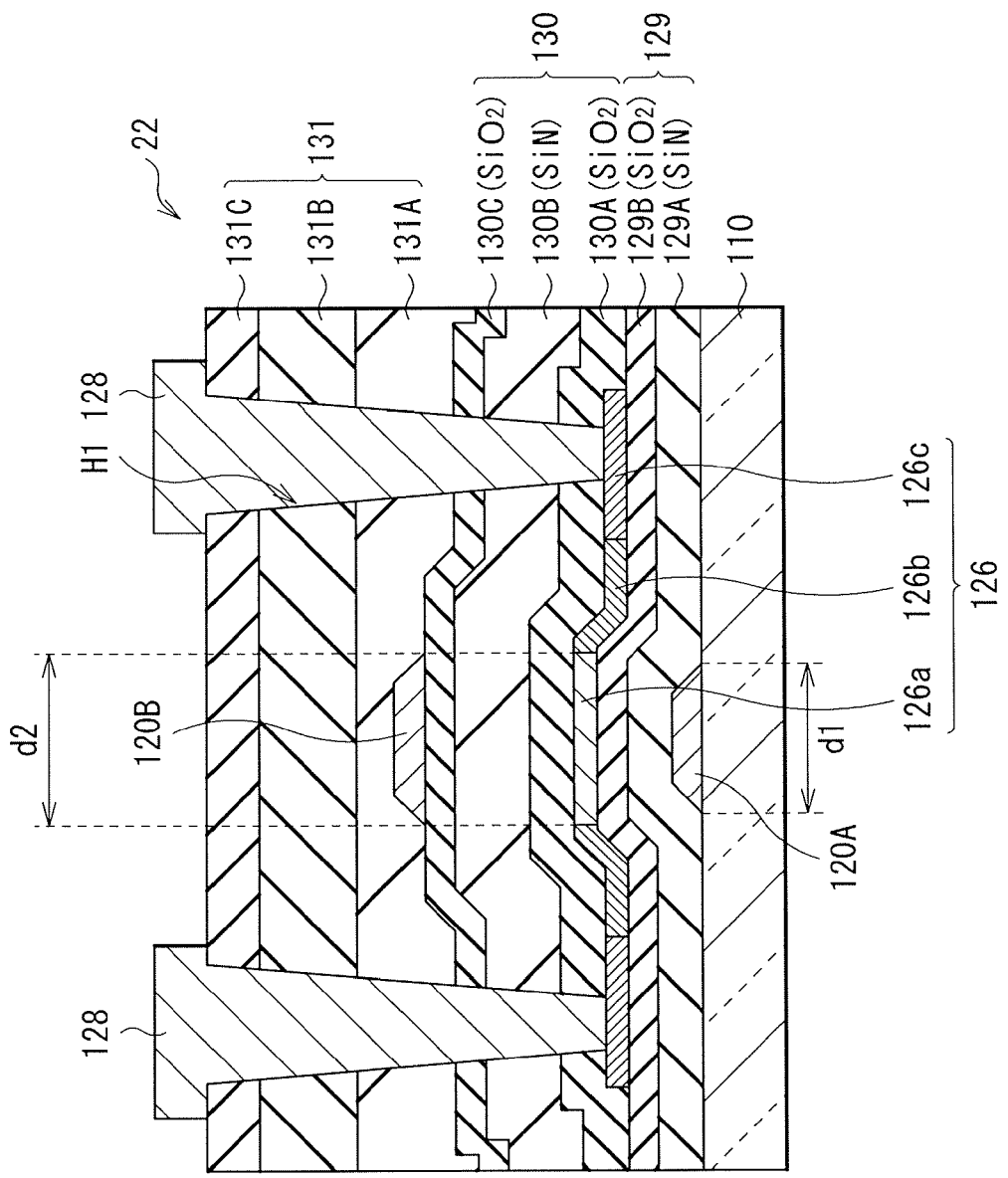
FIG. 4 is a cross-sectional diagram illustrating a configuration of a transistor illustrated in FIG. 3.

FIG. 4 illustrates a cross-sectional configuration of the transistor 22. In the present embodiment, the transistor 22 has an element structure of a so-called dual-gate-type (both-side-gate or double-gate type) thin-film transistor. The transistor 22 may include, for example, a gate electrode 120A (a first gate electrode), a first gate insulating film 129, a semiconductor layer 126, a second gate insulating film 130, a gate electrode 120B (a second gate electrode) in this order on a substrate 110. On the gate electrode 120B, an interlayer insulating film 131 is formed. Further, a contact hole H1 passing through the interlayer insulating film 131 and the second gate insulating film 130 is formed. On the interlayer insulating film 131, the source-drain electrodes 128 are each formed to fill the contact hole H1. It is to be noted that a not-illustrated interlayer insulating film is further formed on the source-drain electrodes 128.

The semiconductor layer 126 may include, for example, a channel layer 126a (an active layer), an LDD layer 126b (a low concentration impurity layer), and an $N^+$ layer 126c. The LDD layer 126b is provided to reduce a leakage current, and is formed to be adjacent to the channel layer 126a (between the channel layer 126a and the $N^+$ layer 126c). To be more specific, the LDD layer 126b may only be formed to be adjacent to one or both of an end on a source side and an end on a drain side of the channel layer 126a, but here, the LDD layer 126b is formed on both sides of the channel layer 126a. Further, as for impurity concentration of the LDD layer 126b, this impurity concentration in the pixel section 11 may be either the same as or different from that in the peripheral circuit section. However, the impurity concentration in the pixel section 11 may be preferably higher than that in the peripheral circuit section. This is because, in this case, the leakage current is effectively reduced.

The semiconductor layer 126 may be configured using, for example, a silicon system semiconductor such as amorphous silicon, micro-crystal silicon, and poly-silicon, and preferably, low temperature poly-silicon (LTPS) may be used. Alternatively, the semiconductor layer 126 may be configured using an oxide semiconductor such as indium gallium zinc oxide (InGaZnO) and zinc oxide (ZnO).

The source-drain electrode 128 serves as a source or a drain. The source-drain electrode 128 may be, for example, a single layer film made of any of elements including titanium (Ti), aluminum (Al), molybdenum (Mo), tungsten (W), and chromium (Cr), or may be a laminated film including two or more of these elements.

The gate electrodes 120A and 120B may each be, for example, a single layer film made of any of elements including molybdenum, titanium, aluminum, tungsten, and chromium, or may be a laminated film including two or more of these elements. The gate electrodes 120A and 120B are provided to face each other with the semiconductor layer 126 interposed therebetween. For example, to the gate electrodes 120A and 120B, respective voltages equal to each other may be applied.

In the present embodiment, the gate electrodes 120A and 120B are provided in a region not facing the LDD layer 126b (i.e., not overlapping the LDD layer 126b). For example, the gate electrodes 120A and 120B are formed in a region whose width is equal to or less than a width of the active layer 126a. It is to be note that an allowable range of an amount of overlap between the LDD layer 126b and each of the gate electrodes 120A and 120B will be described later.

Specifically, the gate electrode 120B is provided to face the channel layer 126a, and may have, for example, a width (a gate length) d2 substantially equal to the width of the channel layer 126a. This is because the channel layer 126a, the LDD layer 126b, and the $N^+$ layer 126c are formed by performing impurity doping through self-alignment (using the gate electrode 120B as a mask), after the gate electrode 120B is formed. On the other hand, the gate electrode 120A is provided to face the channel layer 126a, and has a width d1 smaller than the width d2 of the gate electrode 120B.

Further, the transistor 22 serving as the switching element is formed not only in the pixel section 11, but also in the peripheral circuit section (such as the row scanning section 13). The element structure including the above-described gate electrodes 120A and 120B may only be formed selectively in the pixel section 11, and in the peripheral circuit section, an element structure is not limited to the above-described element structure. This is because, in the peripheral circuit section, the radiation Rrad such as X-rays is often shielded, and radiation resistance is less necessary than that in the pixel section 11.

The first gate insulating film 129 and the second gate insulating film 130 may each include, for example, a silicon oxide film (a silicon compound film including oxygen) made of a material such as silicon oxide (SiOx) and silicon oxynitride (SiON). Specifically, for example, the first gate insulating film 129 and the second gate insulating film 130 may each be a single layer film made of a material such as silicon oxide and silicon oxynitride, or may each be a laminated film including such a silicon oxide film and a silicon nitride film made of a material such as silicon nitride (SiNx). In either of the first gate insulating film 129 and the second gate insulating film 130, the above-described silicon oxide film is provided on the semiconductor layer 126 side (to be adjacent to the semiconductor layer 126). When the semiconductor layer 126 is made of, for example, the low temperature poly-silicon, a silicon oxide film may be formed to be adjacent to the semiconductor layer 126, for a reason in a manufacturing process.

The first gate insulating film 129 and the second gate insulating film 130 may each be, preferably, a laminated film including the silicon oxide film and the silicon nitride film described above. Specifically, the first gate insulating film 129 may be, for example, a laminated film including a silicon nitride film 129A and a silicon oxide film 129B in this order from the substrate 110 side. The second gate insulating film 130 may be, for example, a laminated film including a silicon oxide film 130A, a silicon nitride film 130B, and a silicon oxide film 130C in this order from the semiconductor layer 126 side. Further, a thickness of each of the first gate insulating films 129 and the second gate insulating film 130 is not limited in particular. For example, the thickness of the second gate insulating film 130 may be larger than the thickness of the first gate insulating film 129.

The interlayer insulating film 131 may be, for example, a single layer film made of any of silicon oxide, silicon oxynitride, and silicon nitride, or a laminated film including two or more of these. For example, the interlayer insulating film 131 may be a layer in which a silicon oxide film 131A, a silicon nitride film 131B, and a silicon oxide film 131C are laminated in this order from the gate electrode 120B side. It is to be noted that another interlayer insulating film may be further formed to cover the interlayer insulating film 131 and the source-drain electrodes 128.

(Row Scanning Section 13)

The row scanning section 13 includes a shift register circuit to be described later, a predetermined logical circuit, etc. The row scanning section 13 is a pixel driving section (a row scanning circuit) that performs driving (line-sequential scanning) of the plurality of pixels 20 in the pixel section 11 row by row (by a horizontal line unit). Specifically, the row scanning section 13 may perform image pickup operation such as reading operation and reset operation of each of the pixels 20 by, for example, line-sequential scanning. It is to be noted that, this line-sequential scanning is performed by supplying the above-described row scanning signal to each of the pixels 20 through the readout control line Lread.

(A/D Conversion Section 14)

The A/D conversion section 14 includes a plurality of column selection sections 17 each provided for each plurality of (here, four) signal lines Lsig. The A/D conversion section 14 performs A/D conversion (analog-to-digital conversion) based on a signal voltage (a voltage corresponding to the signal charge) inputted through the signal line Lsig. As a result, output data Dout (an image pickup signal) that is a digital signal is generated and then outputted to outside.

Figure 5:
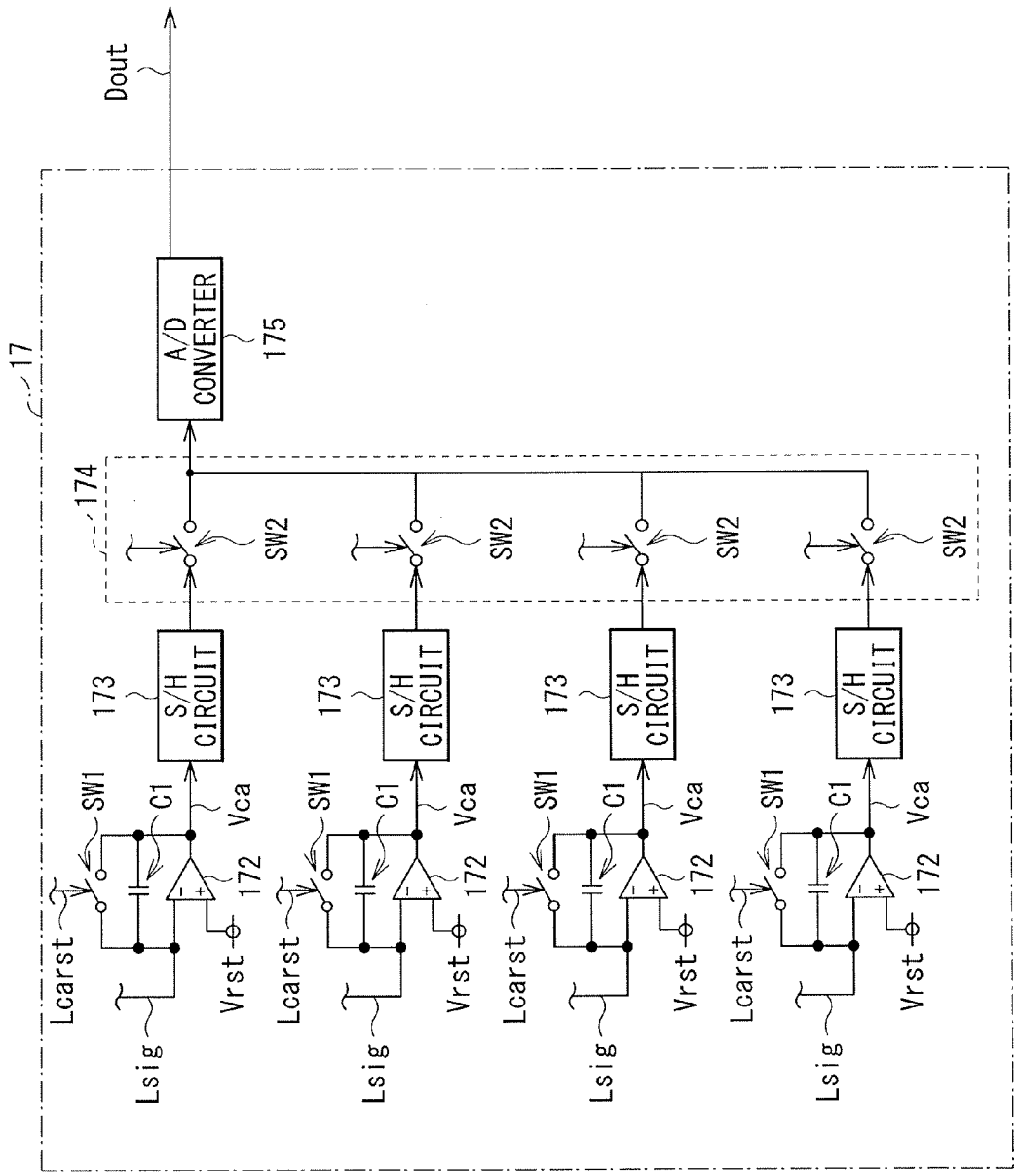
FIG. 5 is a block diagram illustrating a detailed configuration example of a column selection section illustrated in FIG. 1.

For example, as illustrated in FIG. 5, each of the column selection sections 17 may include a charge amplifier 172, a capacitive element (a capacitor, a feedback capacitor, or the like) C1, a switch SW1, a sample hold (S/H) circuit 173, a multiplexor circuit (a selection circuit) 174 including four switches SW2, and an A/D converter 175. Of these components, the charge amplifier 172, the capacitive element C1, the switch SW1, the S/H circuit 173, and the switch SW2 are provided for each of the signal lines Lsig. The multiplexor circuit 174 and the A/D converter 175 are provided for each of the column selection sections 17. It is to be noted that the charge amplifier 172, the capacitive element C1, and the switch SW1 form the charge amplifier circuit 171 in FIG. 3.

The charge amplifier 172 is an amplifier provided to perform conversion (Q-V conversion) in which the signal charge read out from the signal line Lsig is converted to a voltage. In the charge amplifier 172, one end of the signal line Lsig is connected to an input terminal on a negative side (− side), and a predetermined reset voltage Vrst is inputted to an input terminal on a positive side (+ side). Between an output terminal and the input terminal on the negative side of the charge amplifier 172, feedback connection is established through a parallel connection circuit between the capacitive element C1 and the switch SW1. In other words, one terminal of the capacitive element C1 is connected to the input terminal on the negative side of the charge amplifier 172, and the other terminal is connected to the output terminal of the charge amplifier 172. Similarly, one terminal of the switch SW1 is connected to the input terminal on the negative side of the charge amplifier 172, and the other terminal is connected to the output terminal of the charge amplifier 172. It is to be noted that an ON/OFF state of the switch SW1 is controlled by a control signal (an amplifier reset control signal) supplied from the system control section 16 through an amplifier reset control line Lcarst.

The S/H circuit 173 is disposed between the charge amplifier 172 and the multiplexor circuit 174 (the switch SW2), and is a circuit provided to temporarily hold an output voltage Vca from the charge amplifier 172.

The multiplexor circuit 174 is a circuit that selectively makes or breaks connection between each of the S/H circuits 173 and the A/D converter 175, when one of the four switches SW2 is sequentially brought to an ON state according to scanning driving by the column scanning section 15.

The A/D converter 175 is a circuit that performs A/D conversion of the output voltage inputted from the S/H circuit 173 through the switch SW2, thereby generating the above-described output data Dout, and outputs the generated output data Dout.

(Column Scanning Section 15)

The column scanning section 15 may include, for example, a shift register, an address decoder, etc. not illustrated, and sequentially drives each of the above-described switches SW2 in the column selection section 17 while scanning each of the switches SW2. By such selective scanning performed by the column scanning section 15, the signal (the above-described output data Dout) of each of the pixels 20 read out through each of the signal lines Lsig is sequentially outputted to the outside.

(System Control Section 16)

The system control section 16 controls each operation of the row scanning section 13, the A/D conversion section 14, and the column scanning section 15. Specifically, the system control section 16 includes a timing generator that generates the above-described various timing signals (control signals). Based on these various timing signals generated by the timing generator, the system control section 16 performs control of driving the row scanning section 13, the A/D conversion section 14, and the column scanning section 15. Based on this control of the system control section 16, each of the row scanning section 13, the A/D conversion section 14, and the column scanning section 15 performs image-pickup driving (line-sequential image-pickup driving) for the plurality of pixels 20 in the pixel section 11, so that the output data Dout is obtained from the pixel section 11.

[Functions and Effects]

In the radiation image-pickup device 1 of the present embodiment, for example, when the radiation Rrad such as X-rays enters the pixel section 11, signal charge based on the entering light may be generated in each of the pixels 20 (here, the photoelectric conversion element 21). At this moment, specifically, in the storage node N illustrated in FIG. 3, a voltage variation corresponding to node capacity occurs due to storage of the generated signal charge. As a result, the input voltage Vin (a voltage corresponding to the signal charge) is supplied to the drain of the transistor 22. Subsequently, when the transistor 22 changes to the ON state in response to the row scanning signal supplied through the readout control line Lread, the above-described signal charge is read out to the signal line Lsig.

The signal charge read out is inputted to the column selection section 17 in the A/D conversion section 14, for each plurality of (here, four) pixel columns, through the signal line Lsig. In the column selection section 17, at first, the Q-V conversion (conversion from signal charge to a signal voltage) is performed in the charge amplifier circuit 171 including the charge amplifier 172 and the like, for each signal charge inputted through each of the signal lines Lsig. Next, for each of the signal voltages after the Q-V conversion (an output voltage Vca from the charge amplifier 172), the A/D conversion is performed in the A/D converter 175 through the S/H circuit 173 and the multiplexor circuit 174. As a result, the output data Dout (the image pickup signal) that is a digital signal is generated. In this way, the output data Dout is sequentially outputted from each of the column selection sections 17, and then transmitted to the outside (or inputted to an internal memory not illustrated).

Comparative Examples

Figure 6A:
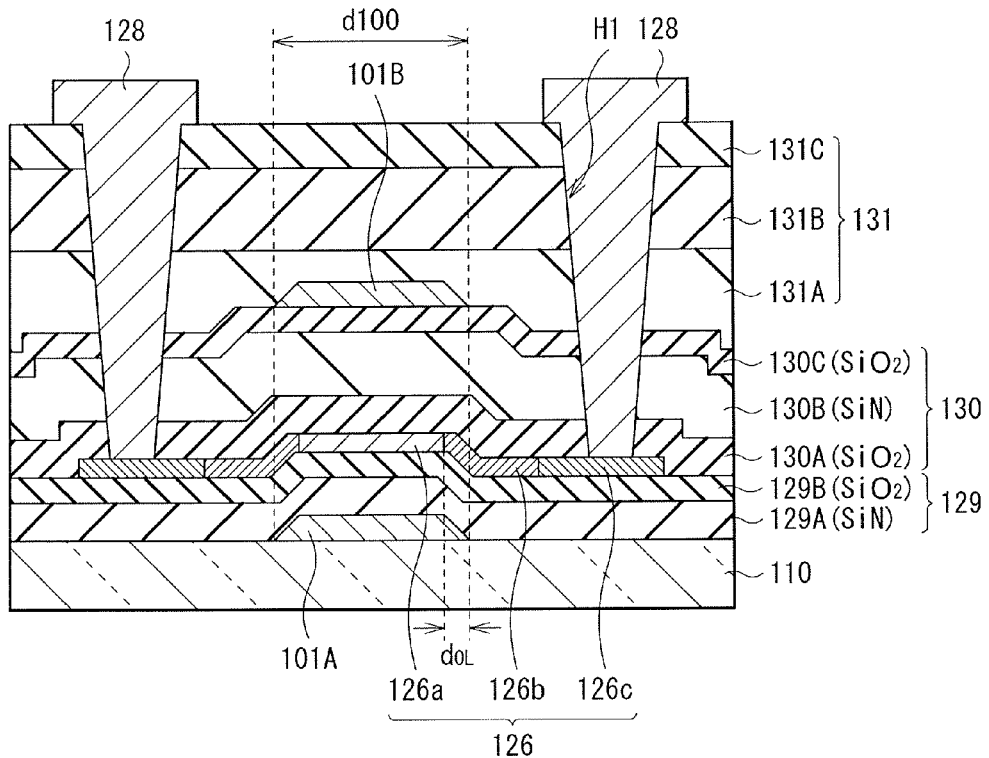
FIG. 6A is a cross-sectional diagram illustrating a configuration example of a transistor according to Comparative Example 1.
Figure 7A:
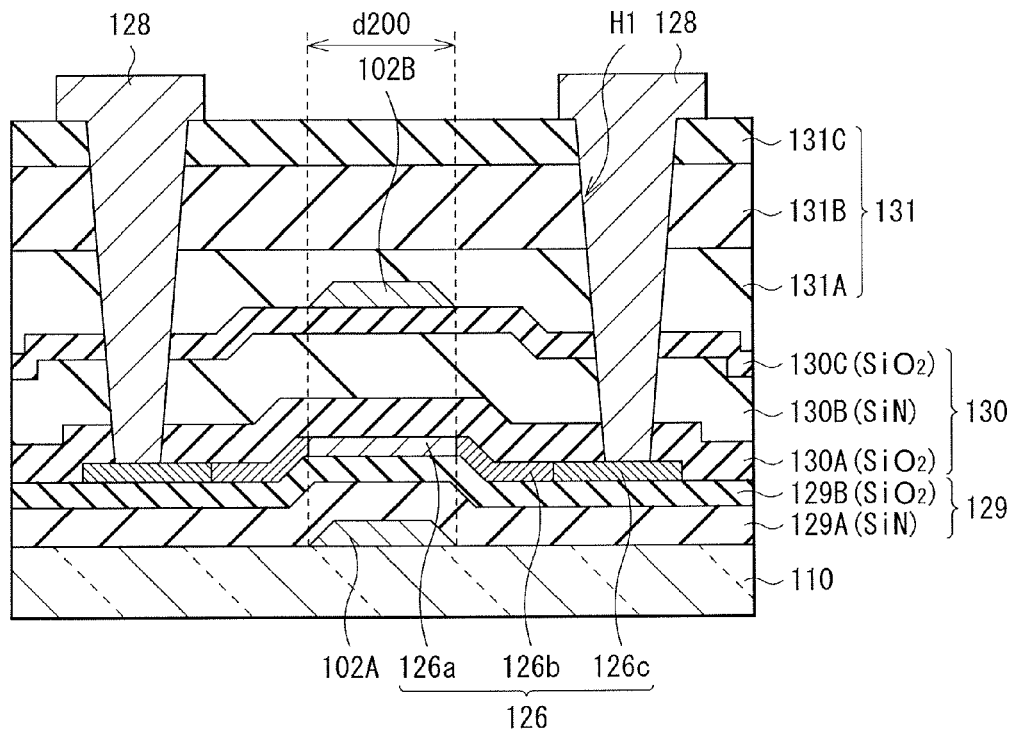
FIG. 7A is a cross-sectional diagram illustrating a configuration example of a transistor according to Comparative Example 2.

Here, FIGS. 6A and 7A each illustrate an element structure according to a comparative example of the present embodiment (Comparative Examples 1 and 2, respectively).

It is to be noted that the same components as those of the element structure of the above-described transistor 22 will be provided with the same reference numerals as those thereof. First, in the element structure according to Comparative Example 1, two gate electrodes (gate electrodes 101A and 101B) are disposed to face each other with the semiconductor layer 126 interposed therebetween, in a manner similar to that of the present embodiment. The first gate insulating film 129, the second gate insulating film 130, the source-drain electrode 128, and the interlayer insulating film 131 have the respective configurations similar to those of the present embodiment. However, in Comparative Example 1, unlike the present embodiment, the gate electrodes 101A and 101B are provided to overlap the LDD layer 126b of the semiconductor layer 126, and the gate electrodes 101A and 101B have respective widths d100 equal to each other. Such an element structure may be formed by, for example, performing an impurity doping process (a process of forming the active layer 126a, the LDD layer 126b, and the N⁺ layer 126c) in the semiconductor layer 126, before formation of the second gate electrode 101B.

Figure 6B:
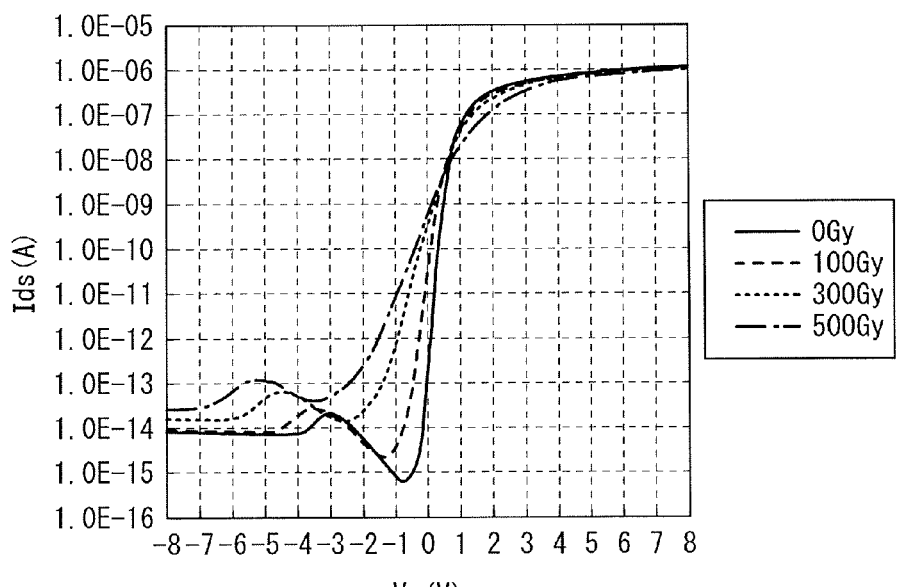
FIG. 6B is a diagram illustrating current-voltage characteristics of the transistor illustrated in FIG. 6A, at the time of X-ray irradiation (0 Gy to 500 Gy).

FIG. 6B illustrates current-voltage characteristics (a relationship between a gate voltage Vg and a drain current Ids) when a tube voltage is 80 kV, and a dose rate is each of 0 Gy, 100 Gy, 300 Gy, and 500 Gy, in the element structure of Comparative Example 1. In the element structure of Comparative Example 1 having the gate electrodes 101A and 101B that overlap the LDD layer 126b as described above, the current-voltage characteristics (the relationship between the gate voltage Vg and the drain current Ids) deteriorate due to irradiation with the radiation (X-rays). Specifically, a leakage current may occur at OFF time, which may cause a phenomenon of a local rise in the drain current Ids (for example, about −3 V in the case of 0 Gy). In addition, when the amount of irradiation of radiation for the transistor 22 increases, a threshold voltage Vth shifts to a negative side (a minus side), or a subthreshold-swing (S) value deteriorates. As a result, an element life of the transistor 22 becomes short.

Figure 7B:
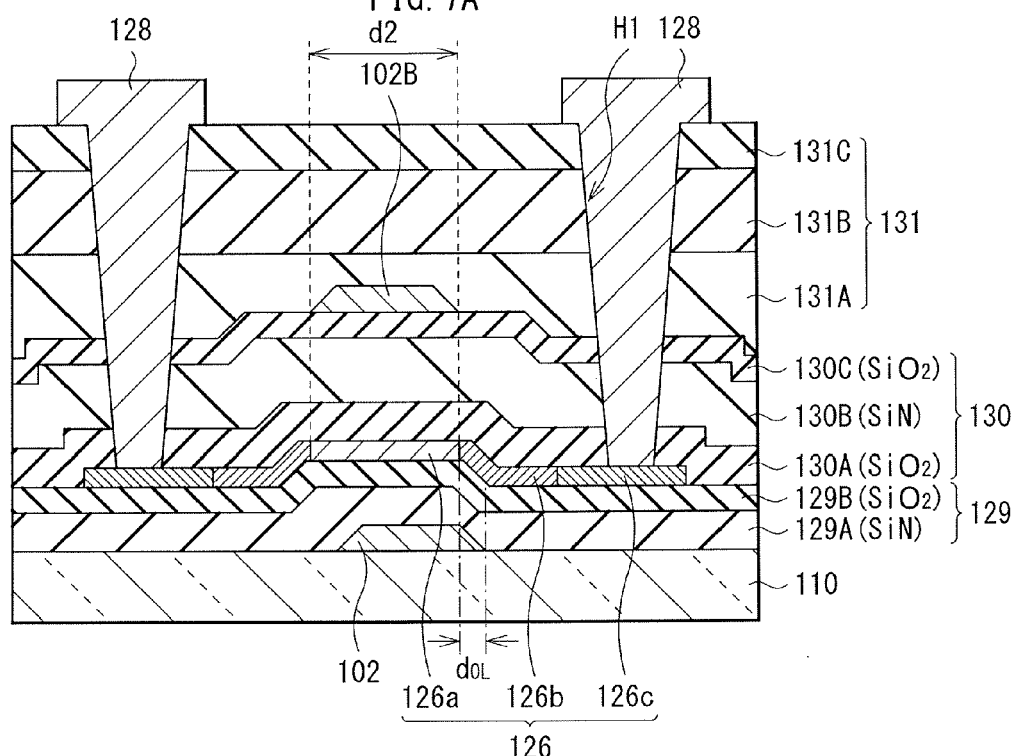
FIG. 7B is a cross-sectional diagram illustrating another configuration example of the transistor according to Comparative Example 2.

Therefore, it is possible to adopt the element structure of Comparative Example 2 illustrated in FIG. 7A. In Comparative Example 2, a gate electrode 102A, the active layer 126a, and a gate electrode 102B are designed to have respective widths d200 substantially equal to each other. In such an element structure, for example, the active layer 126a, the LDD layer 126b, and the N⁺ layer 126c may be formed by self-alignment (by performing impurity doping using the gate electrode 102B as a mask), after formation of the gate electrode 102B. This makes it possible to reduce an overlap region between the gate electrode 102B and the LDD layer 126b. However, actually, an overlap region ($d_{OL}$) between the gate electrode 102A and the LDD layer 126b is formed (FIG. 7B), when misalignment between the gate electrodes 102A and 102B occurs, or when the widths of the gate electrodes 102A and 102B are deviated from designed values.

In contrast, in the transistor 22 of the present embodiment, in the structure in which the gate electrodes 120A and 120B are disposed to face each other with the semiconductor layer 126 interposed therebetween, the gate electrodes 120A and 120B are provided in a region not facing the LDD layer 126b. This makes it possible to suppress the above-described local rise due to the leakage current.

Figure 8:
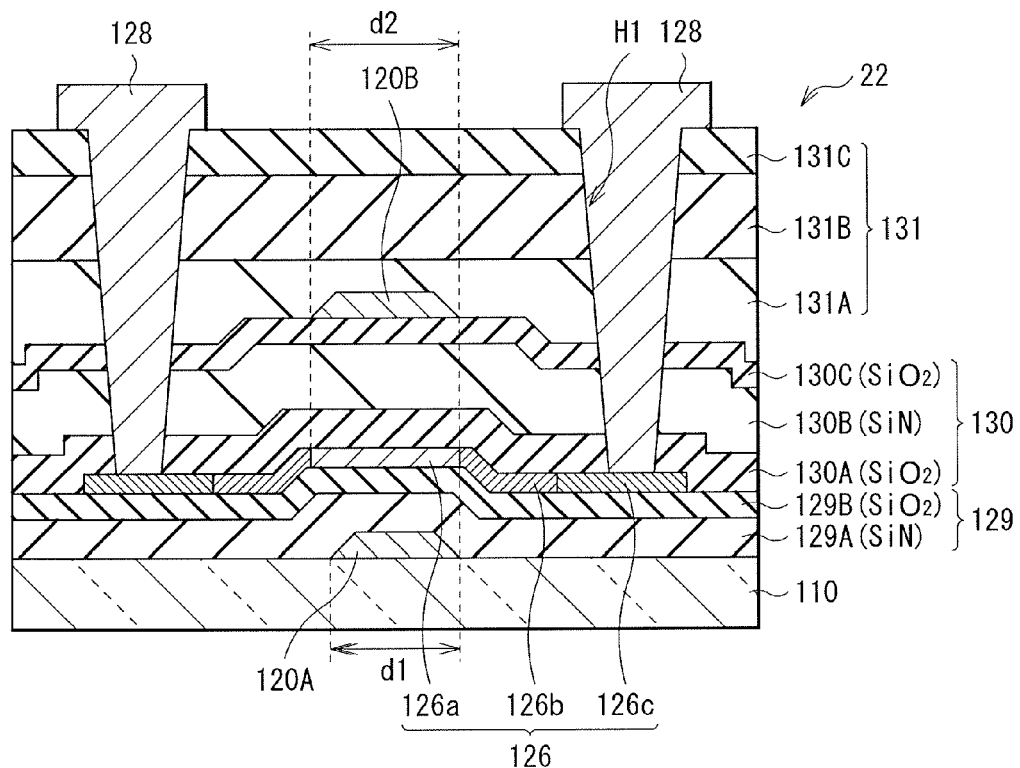
FIG. 8 is a cross-sectional diagram illustrating another configuration example of the transistor illustrated in FIG. 4.

Specifically, it is possible to reduce an overlap region between the gate electrode 120B and the LDD layer 126b by, for example, allowing the gate electrode 120A and the active layer 126a to have the respective widths (d2) substantially equal to each other (i.e., forming the LDD layer 126b and the like by self-alignment after the formation of the gate electrode 120B). In addition, in the present embodiment, the width d1 of the gate electrode 120A is smaller than the width d2 of the gate electrode 120B (the width of the gate electrode 120A is designed to be a value smaller than that of the width of the gate electrode 120B). Therefore, an overlap region between the gate electrode 120A and the LDD layer 126b is not easily formed, even when misalignment between the gate electrodes 120A and 120B occurs, or even when a line width of the gate electrode 120A is larger than a designed value (FIG. 8).

Here, the transistor 22 of the present embodiment is configured so that the thickness of the second gate insulating film 130 is larger than the thickness of the first gate insulating film 129. In such an element structure, as compared with overlap between the gate electrode 120B provided above the semiconductor layer 126 and the LDD layer 126b, overlap between the gate electrode 120A provided below the semiconductor layer 126 and the LDD layer 126b exerts an influence on the characteristics more easily. This is because an electric field generated between the gate electrode 120A and the LDD layer 126b is stronger than an electric field generated between the gate electrode 120B and the LDD layer 126b. Therefore, the width d1 of the gate electrode 120A is designed to be smaller than the width d2, not to cause overlap between the gate electrode 120A and the LDD layer 126b. This allows characteristic deterioration in the above-described dual-gate-type element structure to be suppressed effectively.

(LDD Overlap Amount of Gate Electrode 120A)

The amount of overlap between the gate electrode 120A and the LDD layer 126b (the width of the overlap region) is ideally zero. However, actually, this amount of overlap may be allowed, for example, in a range from about −0.2 µm to about +0.1 µm, in consideration of an error and the like in a process, such as misalignment.

Figure 9:
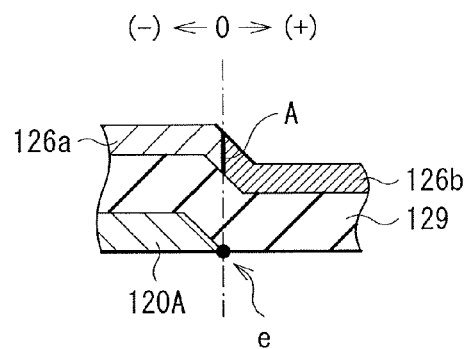
FIG. 9 is a schematic diagram used to describe an allowable range of an amount of overlap.

It is to be noted that, as schematically illustrated in FIG. 9, when the position of a border (a border A) between the active layer 126a and the LDD layer 126b matches with the position of an end "e" of the gate electrode 120A, the amount of overlap is assumed to be zero. Further, a reference numeral "+" (plus) represents a case in which the end "e" is located on the LDD layer 126b side relative to the position of the border A where the amount of overlap is zero, i.e., a case in which the gate electrode 120A and the LDD layer 126b overlap each other. On the other hand, a reference numeral "−" (minus) represents a case in which the end "e" is located on the active layer 126a side relative to the position of the border A where the amount of overlap is zero, i.e., a case in which the gate electrode 120A and the LDD layer 126b are away from each other without overlapping.

Figure 10A:
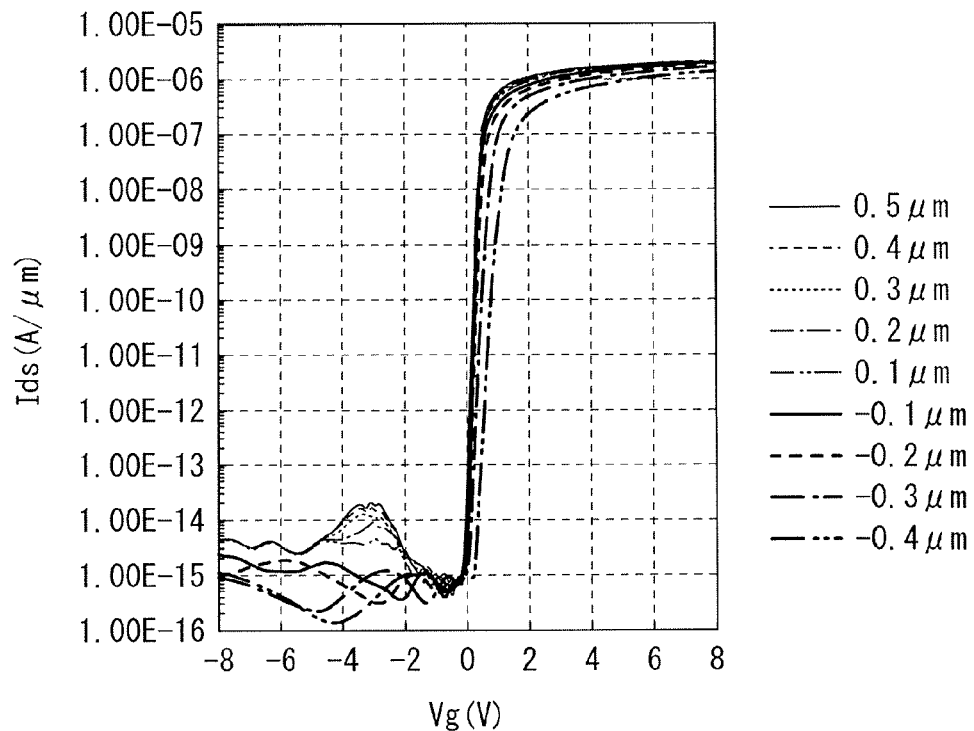
FIG. 10A is a characteristic diagram used to describe an influence of the amount of overlap between a gate (on a bottom side) and a lightly doped drain (LDD), on transistor characteristics.
Figure 10B:
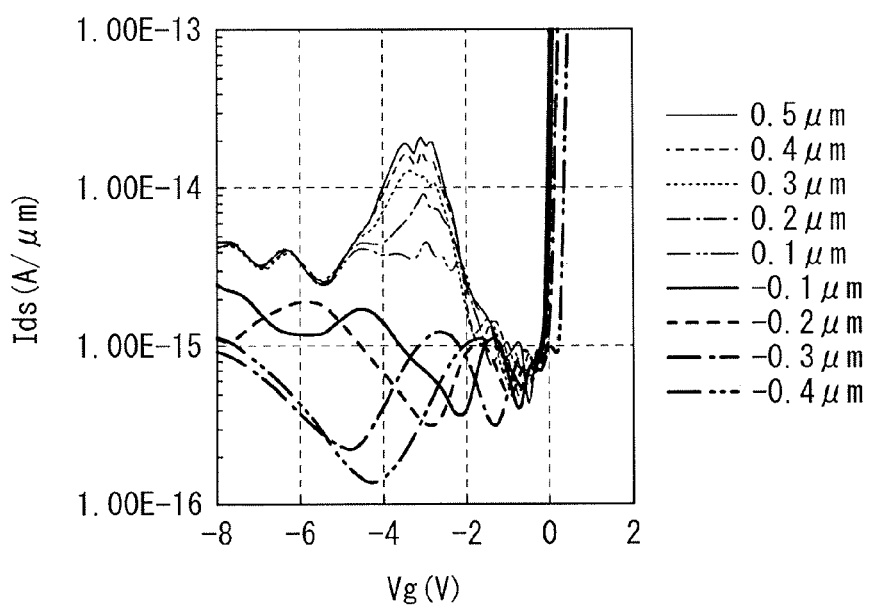
FIG. 10B is an enlarged diagram of an OFF region in FIG. 10A.

FIG. 10A illustrates a result of simulation for current-voltage characteristics, when the amount of overlap between the gate electrode 120A and the LDD layer 126b is varied. FIG. 10B illustrates an enlarged OFF region in FIG. 10A. The amount of overlap was varied by a 0.1 µm in a range from −0.4 µm to +0.5 µm (except 0 µm). The following was found from this result. When the amount of overlap between the gate electrode 120A and the LDD layer 126b was +0.1 µm or less, a local rise in the drain current due to a leakage current was suppressed, and the value of the drain current Ids remained substantially the same, in a range of the gate voltage Vg from −2 V to −8 V. On the other hand, when the amount of overlap was −0.2 µm or less, the S value had a tendency to deteriorate. From these results, the amount of overlap may be desirably in a range from −0.2 µm to +0.1

μm. In other words, when the amount of overlap is within this range, it is possible to obtain an effect substantially equivalent to an effect obtained when the amount of overlap is zero, and the gate electrode 120A may be assumed not to be overlapping the LDD layer 126b (to be formed in a region not facing the LDD layer 126b). It is to be noted that, in the above-described simulation, the thickness of the gate electrode 120A (Mo) was 65 nm, and the thickness of the gate electrode 120B (Mo) was 90 nm. An effective gate L length of each of the gate electrodes 120A and 120B was 2.5 μm, a gate W length of the same was 2.0 μm. Further, in the first gate insulating film 129, a thickness of the silicon nitride film 129A was 83 nm, and a thickness of the silicon oxide film 129B was 14 nm. In the second gate insulating film 130, a thickness of the silicon oxide film 130A was 29 nm, a thickness of the silicon nitride film 130B was 62 nm, and a thickness of the silicon oxide film 130C was 14 nm. Furthermore, an LDD length (a width of each of the LDD layers 126b) was 1.85 μm.

(LDD Overlap Amount of Gate Electrode 120B)

Figure 11:
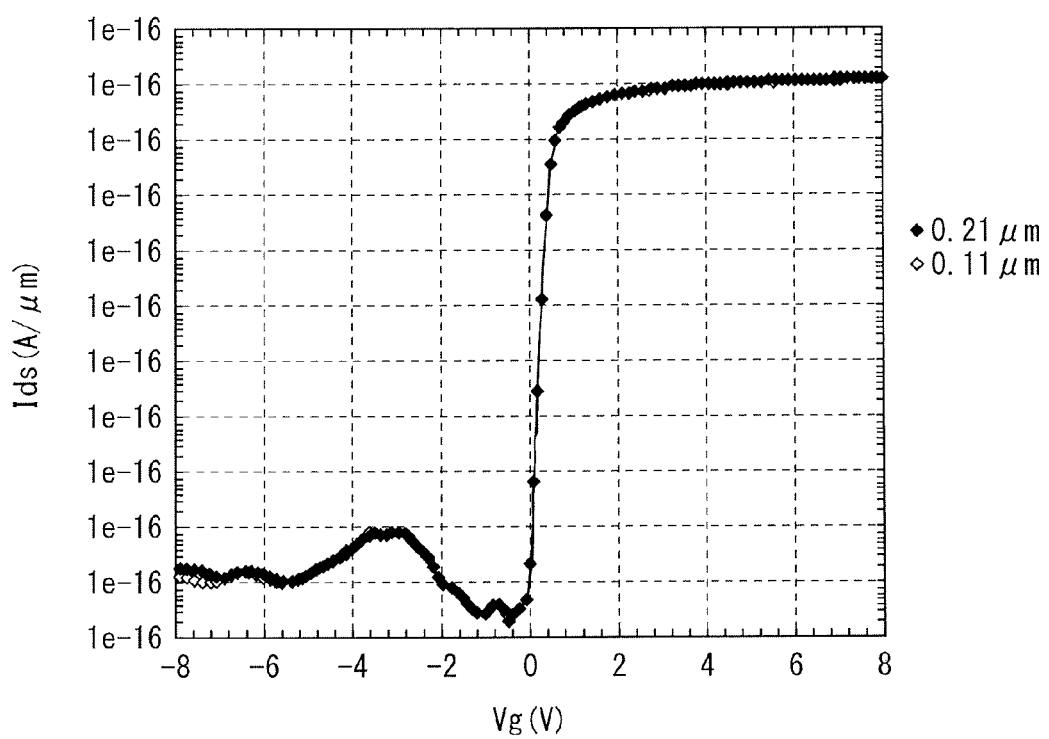
FIG. 11 is a characteristic diagram used to describe an influence of the amount of overlap between a gate (on a top side) and the LDD, on the transistor characteristics.

On the other hand, the amount of overlap between the gate electrode 120B and the LDD layer 126b exerts an influence on the characteristics less easily, when the thickness of the second gate insulating film 130 is larger than that of the first gate insulating film 129. For example, as illustrated in FIG. 11, there was almost no difference between the characteristics when the amount of overlap was 0.21 μm and the characteristics when the amount of overlap was 0.11 μm. The LDD layer 126b and the like are formed by self-alignment after the formation of the gate electrode 120B. Therefore, large overlap between the LDD layer 126b and the gate electrode 120B hardly occurs. Even if such large overlap occurs, the amount of this overlap is allowed in a range wider than that of the above-described gate electrode 120A.

Figure 12:
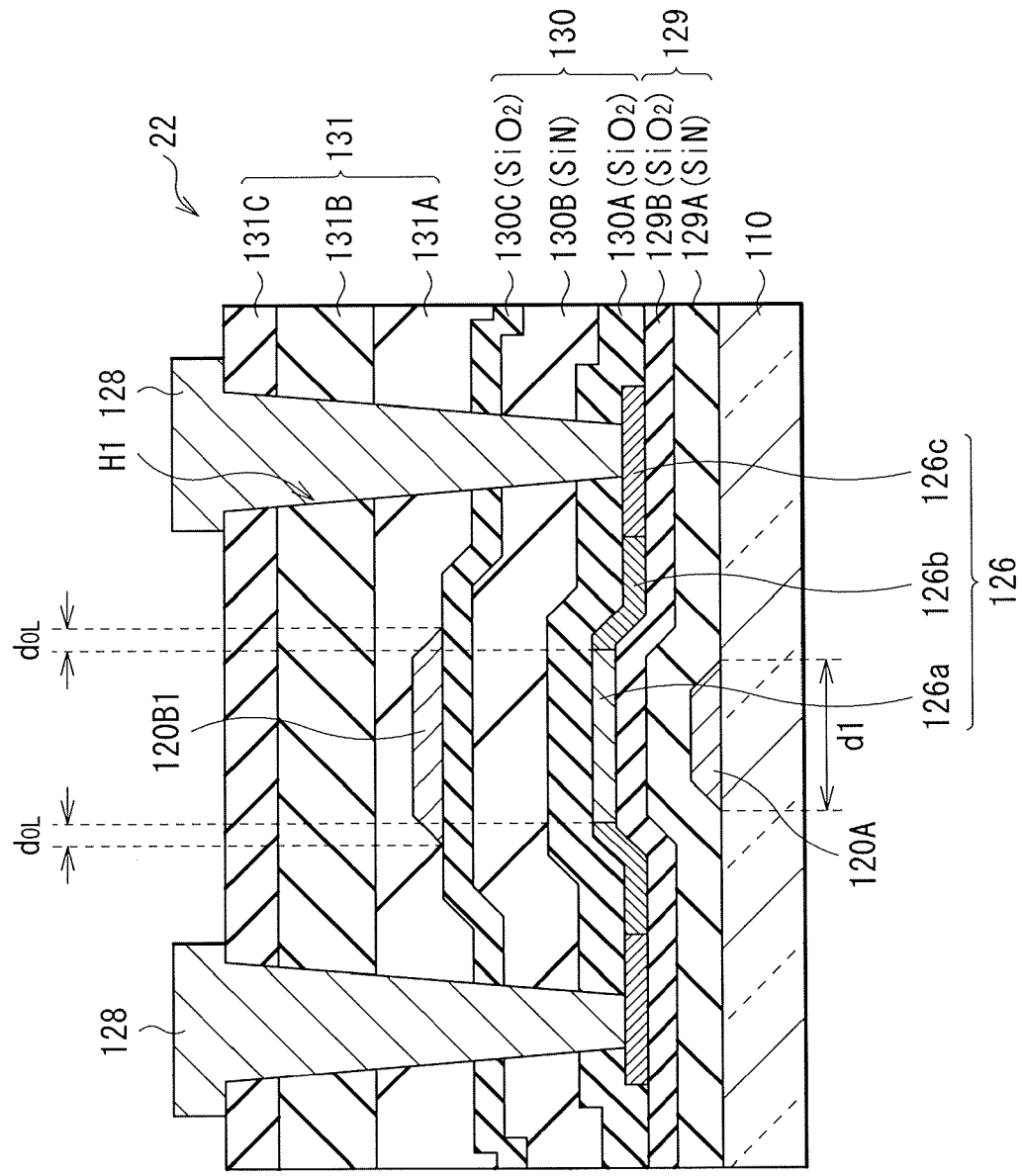
FIG. 12 is a cross-sectional diagram illustrating another configuration example of a gate electrode (on the top side).

For the above reasons, "not facing" according to embodiments of the present disclosure includes some allowable range, in addition to a state in which each of the gate electrodes 120A and 120B does not overlap the LDD layer 126b at all (a state in which the amount of overlap is zero or less). Further, in the present embodiment, the LDD layer 126b is formed by self-alignment after the formation of the gate electrode 120B and therefore, the gate electrode 120B is disposed not to face the LDD layer 126b (neither the gate electrode 120A nor 120B faces the LDD layer 126b). However, this configuration is not necessarily limitative. When the thickness of the second gate insulating film 130 is larger than that of the first gate insulating film 129, the gate electrode 120B may overlap the LDD layer 126b, as illustrated in FIG. 12, for example. In other words, the LDD layer 126b may be formed before the formation of the gate electrode 120B. However, neither the gate electrode 120A nor 120B facing the LDD layer 126b as in the present embodiment (FIG. 4) may be more desirable.

As described above, in the present embodiment, in the transistor 22 provided to read the signal charge from each of the pixels 20, the gate electrodes 120A and 120B are disposed to face each other with the active layer 126a interposed therebetween, and are provided in the region not facing the LDD layer 126b. This makes it possible to suppress a local rise due to a leakage current at the OFF time of the transistor 22, and therefore to improve the element life. Accordingly, it is possible to improve reliability.

It is to be noted that, in the above-described embodiment, the configuration in which the LDD layer 126b is formed on both sides (the source side and the drain side) of the active layer 126a in the semiconductor layer 126 is taken as an example. However, the LDD layer 126b may be provided only on one side (the source side or the drain side) of the active layer 126a. When the LDD layer 126b is provided only on one side, the LDD layer 126b may be desirably formed on the drain side of the active layer 126a.

Next, modifications of the above-described embodiment will be described. The same components as those of the above-described embodiment will be provided with the same reference numerals as those thereof, and will not be described as appropriate.

[Modification 1]

Figure 13:
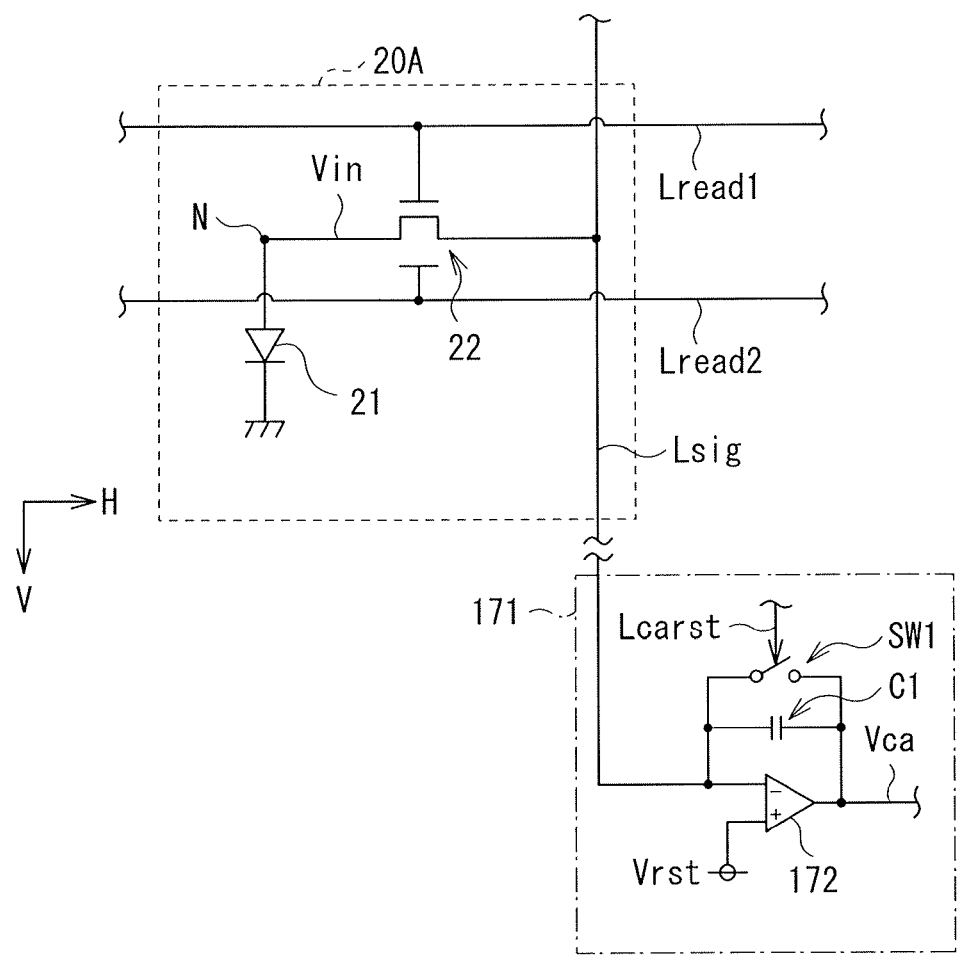
FIG. 13 is a circuit diagram illustrating a configuration of components including a pixel according to Modification 1.

FIG. 13 illustrates a circuit configuration of a pixel (a pixel 20A) according to Modification 1, together with the circuit configuration example of the charge amplifier circuit 171. The pixel 20A has a passive pixel circuit, and includes the one photoelectric conversion element 21 and the one transistor 22, in a manner similar to that of the pixel 20 of the above-described embodiment. Further, the readout control line Lread (Lread1 and Lread2) and the signal line Lsig are connected to the pixel 20A.

However, in the pixel 20A of the present modification, unlike the pixel 20 of the above-described embodiment, an anode of the photoelectric conversion element 21 is connected to the storage node N and a cathode thereof is connected to a power supply. In this way, in the pixel 20A, the storage node N may be connected to the anode of the photoelectric conversion element 21. It is possible to obtain effects similar to those of the radiation image-pickup device 1 of the above-described embodiment, in this case as well.

[Modification 2]

Figure 14:
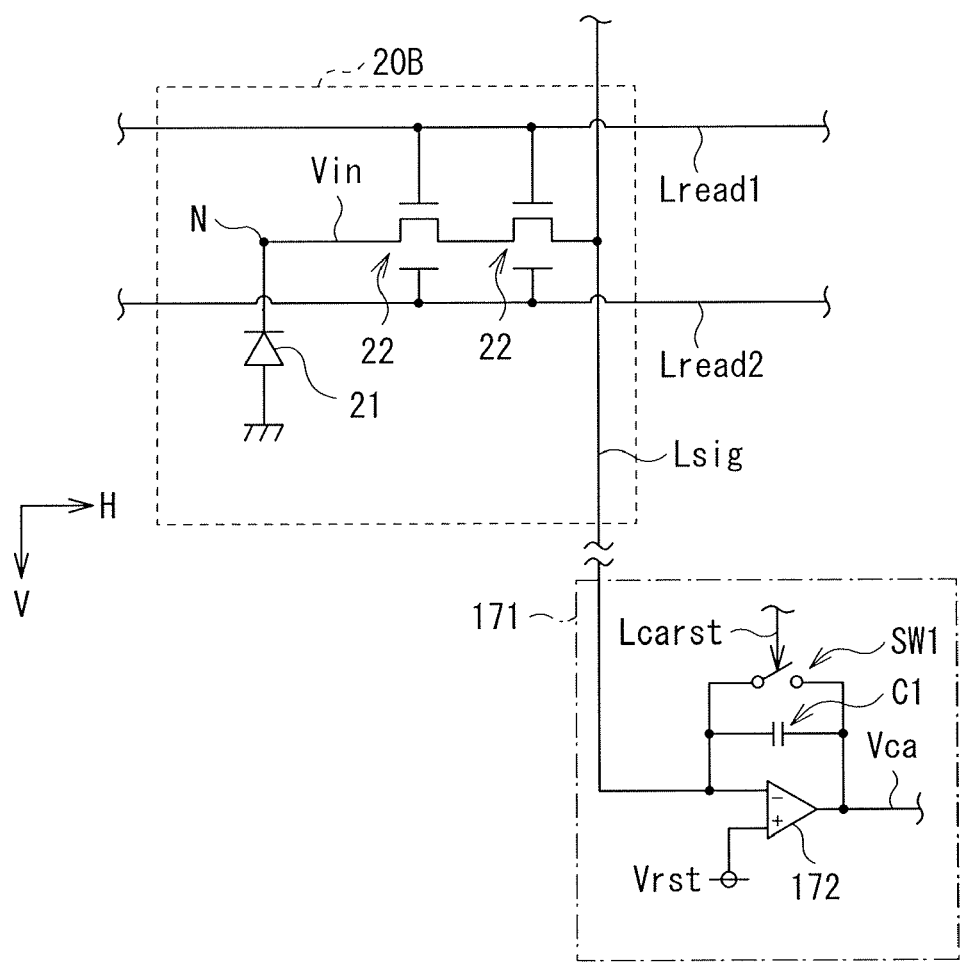
FIG. 14 is a circuit diagram illustrating a configuration of components including a pixel according to Modification 2.

FIG. 14 illustrates a circuit configuration of a pixel (a pixel 20B) according to Modification 2, together with the circuit configuration example of the charge amplifier circuit 171. The pixel 20B has a passive circuit configuration in a manner similar to that of the pixel 20 of the above-described embodiment, and is connected to the readout control line Lread (Lread1 and Lread2) and the signal line Lsig.

However, in the present modification, the pixel 20B includes the one photoelectric conversion element 21 and the two transistors 22. The two transistors 22 are connected to each other in series (the source or drain of one of the two transistors 22 is electrically connected to the source or drain of the other). Further, the gate in each of the transistors 22 is connected to the readout control line Lread.

In this way, the two transistors 22 connected in series may be provided in the pixel 20B. It is possible to obtain effects similar to those of the above-described embodiment, in this case as well.

[Modifications 3 and 4]

Figure 15:
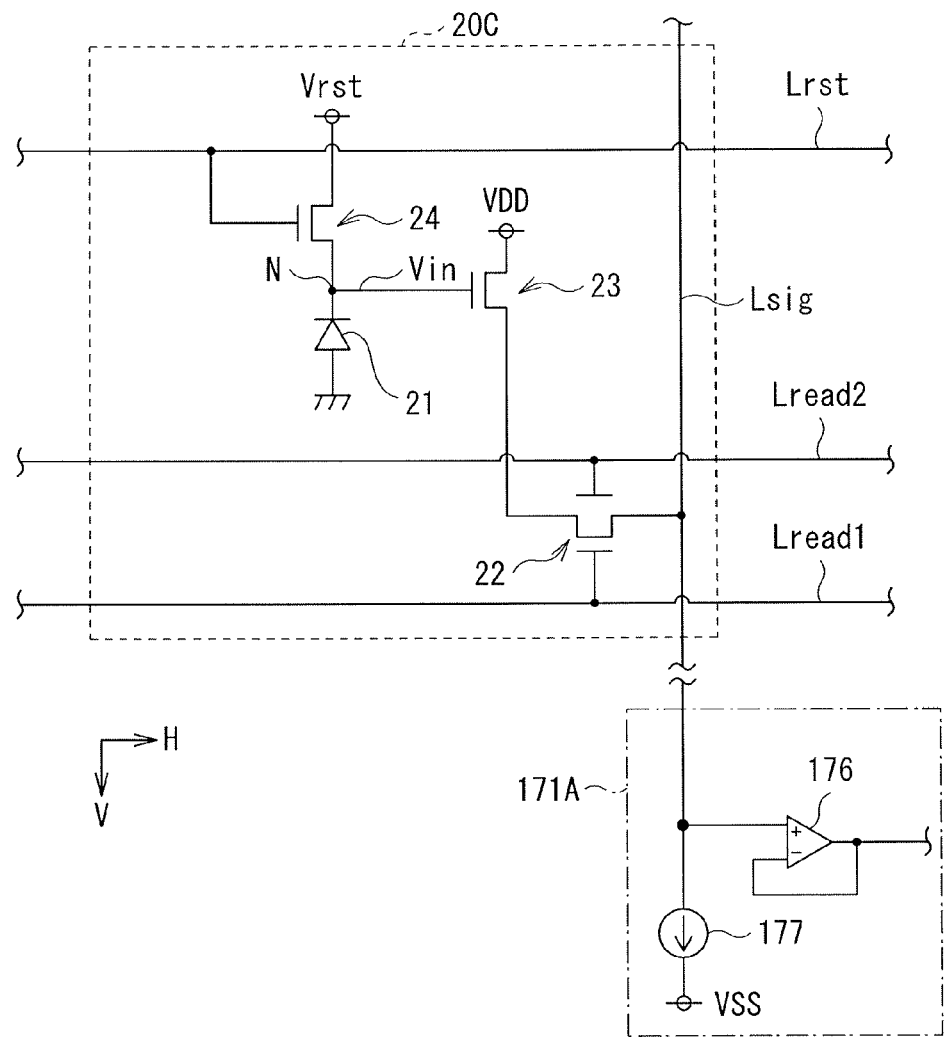
FIG. 15 is a circuit diagram illustrating a configuration of components including a pixel according to Modification 3.
Figure 16:
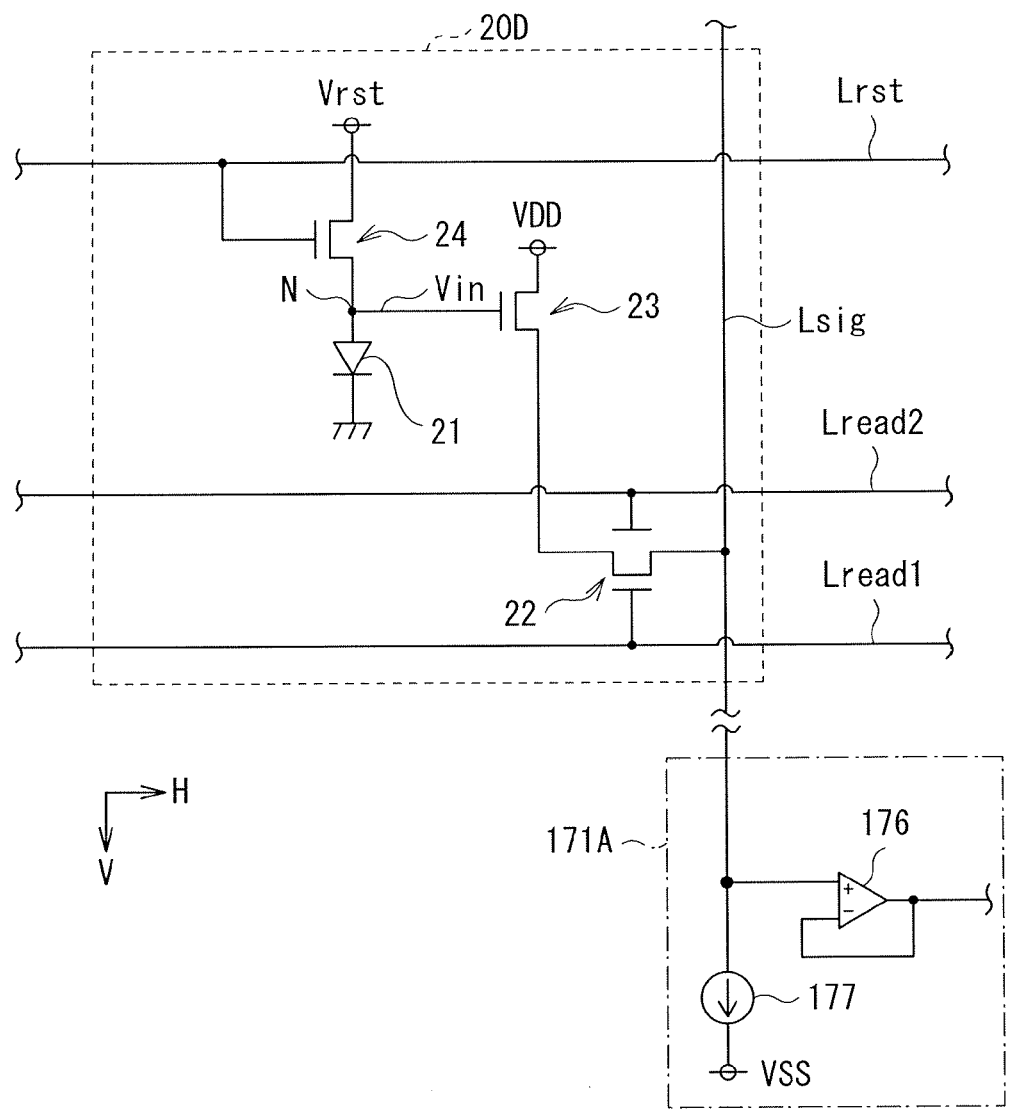
FIG. 16 is a circuit diagram illustrating a configuration of components including a pixel according to Modification 4.

FIG. 15 illustrates a circuit configuration of a pixel (a pixel 20C) according to Modification 3, together with a circuit configuration example of an amplifier circuit 171A. FIG. 16 illustrates a circuit configuration of a pixel (a pixel 20D) according to Modification 4, together with the circuit configuration example of the amplifier circuit 171A. The pixels 20C and 20D each have a so-called active pixel circuit, unlike the pixels 20, 20A, and 20B described above.

The pixels 20C and 20D each include the one photoelectric conversion element 21, and three transistors 22, 23, and 24. Further, in addition to the readout control line Lread and the signal line Lsig, a reset control line Lrst is connected to each of the pixels 20C and 20D.

In each of the pixels 20C and 20D, two gates of the transistor 22 are connected to the readout control lines Lread1 and Lread2, a source thereof may be connected, for example, to the signal line Lsig, and a drain thereof may be connected, for example, to a drain of the transistor 23 forming a source follower circuit. A source of the transistor 23 may be connected, for example, to a power supply VDD. Further, a gate of the transistor 23 may be connected, for example, to the cathode (in the example of FIG. 15) or the anode (in the example of FIG. 16) of the photoelectric conversion element 21, and to a drain of the transistor 24 serving as a reset transistor, through the storage node N. A gate of the transistor 24 is connected to the reset control line Lrst, and, for example, the reset voltage Vrst may be applied to a source thereof. In Modification 3 of FIG. 15, the anode of the photoelectric conversion element 21 is connected to ground (grounded), and, in Modification 4 of FIG. 16, the cathode of the photoelectric conversion element 21 is connected to the power supply.

The amplifier circuit 171A includes a constant current source 177 and an amplifier 176, in place of the charge amplifier 172, the capacitor C1, and the switch SW1, in the above-described column selection section 17. In the amplifier 176, the signal line Lsig is connected to an input terminal on a positive side, and an output terminal and an input terminal on a negative side are connected to each other, so that a voltage follower circuit is formed. It is to be noted that one terminal of the constant current source 177 is connected to one end side of the signal line Lsig, and a power supply VSS is connected to the other terminal of the constant current source 177.

Application Example

The radiation image-pickup device according to any of the above-described embodiment and modifications is applicable to a radiation image-pickup system, as will be described below.

Figure 17:
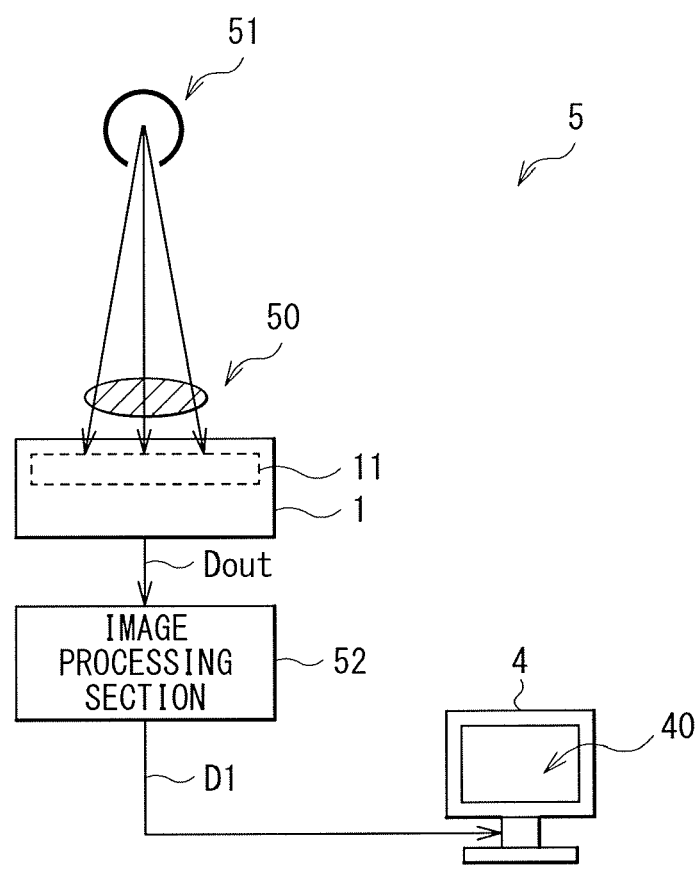
FIG. 17 is a schematic diagram illustrating a schematic configuration of a radiation image-pickup display system according to an application example.

FIG. 17 schematically illustrates a schematic configuration example of a radiation image-pickup display system (a radiation image-pickup display system 5) according to an application example. The radiation image-pickup display system 5 includes the radiation image-pickup device 1 having the pixel section 11 described above. The radiation image-pickup display system 5 further includes an image processing section 52, and a display 4.

The image processing section 52 generates image data D1, by performing predetermined image processing on the output data Dout (the image pickup signal) outputted from the radiation image-pickup device 1. Based on the image data D1 generated in the image processing section 52, the display 4 displays an image on a predetermined monitor screen 40.

In the radiation image-pickup display system 5, based on irradiation light (here, radiation) emitted towards a subject 50 from a light source 51 (here, a radiation source such as an X-ray source), the radiation image-pickup device 1 obtains image data Dout of the subject 50, and outputs the obtained image data Dout to the image processing section 52. The image processing section 52 performs the above-described predetermined image processing on the inputted image data Dout, and outputs the image data (display data) D1 after the image processing, to the display 4. The display 4 displays image information (a picked-up image) on the monitor screen 40, based on the inputted image data D1.

In this way, in the radiation image-pickup display system 5 of the present application example, the radiation image-pickup device 1 is allowed to obtain an image of the subject 50 as an electric signal. Therefore, it is possible to display the image by transmitting the obtained electric signal to the display 4. In other words, it is possible to observe an image of the subject 50 without using a typical radiographic film. In addition, it is also possible to support moving-image taking and moving-image display.

Some embodiment, modifications, and application example have been described above, but the contents of the present disclosure are not limited thereto, and may be variously modified. For example, the circuit configuration of the pixel in the pixel section of each of the above-described embodiment and the like is not limited to those (the circuit configuration of each of the pixels 20, and 20A to 20D) described above, and may be other circuit configuration. Similarly, the circuit configuration of each of other components such as the row scanning section and the column selection section is not limited to those of the above-described embodiment and the like, and may be other circuit configuration.

Further, the pixel section, the row scanning section, the A/D conversion section (the column selection section), the column scanning section, and the like of each of the above-described embodiment and the like may be formed, for example, on the same substrate. Specifically, for example, using a polycrystalline semiconductor such as low temperature poly-silicon, the switch and the like in these circuit portions may also be formed on the same substrate. Therefore, for example, driving operation on the same substrate may be performed based on a control signal from an external system control section, which allows achievement of a slim bezel (a frame structure in which three sides are free) and an improvement in reliability in wiring connection.

It is possible to achieve at least the following configurations from the above-described example embodiments of the disclosure.

(1) A radiation image-pickup device including:
a plurality of pixels each configured to generate signal charge based on radiation; and
a field effect transistor used to read the signal charge from each of the plurality of pixels,
wherein the field effect transistor includes
a semiconductor layer including an active layer and a low concentration impurity layer formed to be adjacent to the active layer, and
a first and a second gate electrode disposed to face each other with the active layer interposed therebetween, and
one or both of the first and the second gate electrodes are provided in a region not facing the low concentration impurity layer.

(2) The radiation image-pickup device according to (1), wherein
the field effect transistor further includes a first and a second gate insulating film,
the first gate electrode, the first gate insulating film, the semiconductor layer, the second gate insulating film, and the second gate electrode are provided in order from a substrate side, and
the first gate electrode has a width smaller than a width of the second gate electrode.

(3) The radiation image-pickup device according to (2), wherein the second gate electrode is disposed to face the active layer and has the width substantially same as a width of the active layer.

(4) The radiation image-pickup device according to (2) or (3), wherein a thickness of the second gate insulating film is larger than a thickness of the first gate insulating film.

(5) The radiation image-pickup device according to (4), wherein the first gate electrode is provided in the region not facing the low concentration impurity layer.

(6) The radiation image-pickup device according to (1), wherein both of the first and the second gate electrodes are provided in the region not facing the low concentration impurity layer.

(7) The radiation image-pickup device according to any one of (1) to (6), wherein the first and the second gate electrodes are formed in a pixel section, of the pixel section and a peripheral circuit section, the pixel section having the plurality of pixels, and the peripheral circuit section being peripheral to the pixel section.

(8) The radiation image-pickup device according to any one of (1) to (7), wherein impurity concentration in the low concentration impurity layer is higher in a pixel section having the plurality of pixels than in a peripheral circuit section peripheral to the pixel section.

(9) The radiation image-pickup device according to any one of (1) to (8), wherein the active layer has two ends configured to be electrically connected to a source electrode and a drain electrode, respectively, and the low concentration impurity layer is formed to be adjacent to one or both of the two ends of the active layer.

(10) The radiation image-pickup device according to any one of (1) to (9), wherein the semiconductor layer includes any of amorphous silicon, polycrystal silicon, and microcrystal silicon.

(11) The radiation image-pickup device according to any one of (1) to (10), wherein the semiconductor layer includes low temperature poly-silicon.

(12) The radiation image-pickup device according to any one of (1) to (11), further including a wavelength conversion layer provided on a light incident side of the plurality of pixels, wherein the plurality of pixels each include a photoelectric conversion element, and the wavelength conversion layer is configured to convert the radiation to a wavelength in a sensitivity range of the photoelectric conversion layer.

(13) The radiation image-pickup device according to any one of (1) to (11), wherein the plurality of pixels each include a conversion layer configured to generate the signal charge by absorbing the radiation.

(14) The radiation image-pickup device according to any one of (1) to (13), wherein the radiation includes X-rays.

(15) A radiation image-pickup display system including:

a radiation image-pickup device; and a display configured to perform image display based on an image pickup signal obtained by the radiation image-pickup device, wherein the radiation image-pickup device includes a plurality of pixels each configured to generate signal charge based on radiation, and a field effect transistor used to read the signal charge from each of the plurality of pixels, and the field effect transistor includes a semiconductor layer including an active layer and a low concentration impurity layer formed to be adjacent to the active layer, and a first and a second gate electrode disposed to face each other with the active layer interposed therebetween, and one or both of the first and the second gate electrodes are provided in a region not facing the low concentration impurity layer.

It should be understood by those skilled in the art that various modifications, combinations, sub-combinations, and alterations may occur depending on design requirements and other factors insofar as they are within the scope of the appended claims or the equivalents thereof.

What is claimed is:

1. A radiation image-pickup device comprising:

a plurality of pixels each configured to generate signal charge based on radiation; and a field effect transistor used to read the signal charge from each of the plurality of pixels, wherein the field effect transistor includes a semiconductor layer including an active region and a lightly doped drain (LDD) region formed to be adjacent to the active region, and a first and a second gate electrode disposed to face each other with the active layer interposed therebetween, and both of the first and the second gate electrodes are provided only in a region not facing the LDD region, and the first and second gate electrodes each have a width that is equal to or less than a width of the active region.

2. The radiation image-pickup device according to claim 1, wherein the field effect transistor further includes a first and a second gate insulating film, the first gate electrode, the first gate insulating film, the semiconductor layer, the second gate insulating film, and the second gate electrode are provided in order from a substrate side, and the first gate electrode has a width smaller than a width of the second gate electrode.

3. The radiation image-pickup device according to claim 2, wherein the second gate electrode is disposed to face the active region and has the width substantially same as the width of the active region.

4. The radiation image-pickup device according to claim 2, wherein a thickness of the second gate insulating film is larger than a thickness of the first gate insulating film.

5. The radiation image-pickup device according to claim 1, wherein the first and the second gate electrodes are formed in a pixel section, of the pixel section and a peripheral circuit section, the pixel section having the plurality of pixels, and the peripheral circuit section being peripheral to the pixel section.

6. The radiation image-pickup device according to claim 1, wherein impurity concentration in the LDD layer region is higher in a pixel section having the plurality of pixels than in a peripheral circuit section peripheral to the pixel section.

7. The radiation image-pickup device according to claim 1, wherein the active region has two ends configured to be electrically connected to a source electrode and a drain electrode, respectively, and the LDD region is formed to be adjacent to one or both of the two ends of the active region.

8. The radiation image-pickup device according to claim 1, wherein the semiconductor layer includes any of amorphous silicon, polycrystal silicon, and micro-crystal silicon.

9. The radiation image-pickup device according to claim 8, wherein the semiconductor layer includes low temperature poly-silicon.

10. The radiation image-pickup device according to claim 1, further comprising a wavelength conversion layer provided on a light incident side of the plurality of pixels, wherein the plurality of pixels each include a photoelectric conversion element, and the wavelength conversion layer is configured to convert the radiation to a wavelength in a sensitivity range of the photoelectric conversion element.

11. The radiation image-pickup device according to claim 1, wherein the plurality of pixels each include a conversion layer configured to generate the signal charge by absorbing the radiation.

12. The radiation image-pickup device according to claim 1, wherein the radiation includes X-rays.

13. A radiation image-pickup display system comprising:
a radiation image-pickup device; and
a display configured to perform image display based on an image pickup signal obtained by the radiation image-pickup device,
wherein the radiation image-pickup device includes
a plurality of pixels each configured to generate signal charge based on radiation, and
a field effect transistor used to read the signal charge from each of the plurality of pixels, and
the field effect transistor includes
a semiconductor layer including an active region and a lightly doped drain (LDD) region formed to be adjacent to the active region, and
a first and a second gate electrode disposed to face each other with the active layer interposed therebetween, and
both of the first and the second gate electrodes are provided only in a region not facing the LDD region, and the first and second gate electrodes each have a width that is equal to or less than a width of the active region.

14. The radiation image-pickup display system according to claim 13, wherein
the field effect transistor further includes a first and a second gate insulating film,
the first gate electrode, the first gate insulating film, the semiconductor layer, the second gate insulating film, and the second gate electrode are provided in order from a substrate side, and
the first gate electrode has a width smaller than a width of the second gate electrode.

15. The radiation image-pickup display system according to claim 13, wherein impurity concentration in the LDD layer region is higher in a pixel section having the plurality of pixels than in a peripheral circuit section peripheral to the pixel section.

* * * * *